United States Patent
Nagasawa et al.

[11] Patent Number: 5,254,370
[45] Date of Patent: Oct. 19, 1993

[54] METHOD FOR FORMING A SILICON CARBIDE FILM

[75] Inventors: Hiroyuki Nagasawa, Akishima; Yohichi Yamaguchi, Higashimurayama, both of Japan

[73] Assignee: Hoya Corporation, Tokyo, Japan

[21] Appl. No.: 901,217

[22] Filed: Jun. 19, 1992

[30] Foreign Application Priority Data

Jun. 24, 1991 [JP] Japan .................. 3-178665

[51] Int. Cl.$^5$ ............................... C23C 16/00
[52] U.S. Cl. ......................... 427/249; 427/255; 427/255.2; 427/255.7; 427/294; 427/585
[58] Field of Search .......... 427/255.2, 249, 255, 427/255.7, 294, 585

*Primary Examiner*—Bernard Pianalto
*Attorney, Agent, or Firm*—Nixon & Vanderhye

[57] ABSTRACT

In a method for forming a silicon carbide film by means of a hot wall type CVD apparatus, which comprises placing a substrate S in a reaction tube 1, reducing the pressure in the reaction tube 1 with an exhaust pump 4 while heating the reaction tube 1 with a heater 2, and introducing a plurality of gases into the reaction tube 1 through at least one gas-introducing tube, the silicon carbide film is formed on the substrate S from at least an acetylene gas and a dichlorosilane gas as a plurality of the above gases by alternately repeating the following procedures (A) and (B), (A) introducing the acetylene gas for at least 2 seconds, and (B) introducing the dichlorosilane gas for 3 to 12 seconds. The present invention enables the production of a silicon carbide film excellent in uniformity of the film thickness and film properties and smoothness of the film surface.

10 Claims, 5 Drawing Sheets

METHOD FOR FORMING A SILICON CARBIDE FILM

FIELD OF THE INVENTION

The present invention relates to a method for forming a silicon carbide (SiC) film for use as an X-ray transmissive film for an X-ray mask or a substrate material for a semiconductor device. In particular, it relates to a method for forming a silicon carbide film with a hot wall type CVD apparatus.

PRIOR ART

The conventional method for forming a silicon carbide film with a hot wall type, low pressure CVD apparatus may be carried out by means of an apparatus shown in FIG. 1 (e.g., JP,A Hei 2-262324).

The method for forming a silicon carbide film from an acetylene ($C_2H_2$) gas and a dichlorosilane ($SiH_2Cl_2$) gas as source gases and a hydrogen ($H_2$) gas as a carrier gas by means of the apparatus shown in FIG. 1 is as follows.

First, a plurality of substrates S are vertically placed on a substrate holder boat 3 in a reaction tube 1. An exhaust pump 4 is actuated to reduce the pressure in the reaction tube 1, and the temperature in the reaction tube 1 is elevated with a heater 2. The heater 2 is separated into three heater elements and each heater element is independently worked for temperature control so that the temperature distribution in the reaction tube 1 can be easily controlled.

Second, a hydrogen gas is introduced into the reaction tube 1, and further, three way valves 10 and 11 are switched to introduce an acetylene gas and a dichlorosilane gas into the reaction tube 11 at the same time, whereby a silicon carbide (SiC) film is formed on each substrate S.

In the above introduction, the flow rates of the hydrogen gas, acetylene gas and dichlorosilane gas are controlled with mass flow controllers 7, 8 and 9. The pressure in the reaction tube 1 is measured with a Pirani gauge 6 and controlled with a butterfly valve 5.

The method for forming a silicon carbide film by means of the above hot wall type, low pressure CVD apparatus is excellent in mass productivity since the substrates can be easily uniformly heated and the number of the substrates on which silicon carbide films can be formed per one operation is large.

However, in the above hot wall type, low pressure CVD method, a quartz glass is used as a reaction tube. Therefore, the temperature of the reaction tube is limited to not higher than 1,000° C. For this reason, highly reactive gases at a low temperature such as an acetylene type gas and a dichlorosilane type gas are used as source gases capable of forming silicon carbide films.

When the acetylene type gas and dichlorosilane type gas are simultaneously introduced into the reaction tube as source gases, however, silicon carbide is extremely formed in a gaseous phase in the reaction tube. Therefore, a concentration distribution of the source gases is caused in the reaction tube. The concentration distribution of the source gases causes lack of uniformity of the thickness and properties of silicon carbide films among different substrates.

Further, in a gaseous phase, silicon (Si) is also formed simultaneously with silicon carbide. There is therefore a problem in that excess silicon atoms are included in silicon carbide films grown on the substrates and the silicon atoms deteriorate the transmissivity of the films to visible light and impair the controllability of the growth rate of the silicon carbide.

Further, there is also a problem in that since silicon carbide forms films of a non-oriented polycrystal, the smoothness of the film surface is deteriorated due to anisotropy of the growth rate with regard to crystal orientation.

SUMMARY OF THE INVENTION

It is therefore an object of the present invention to provide a method for forming a silicon carbide (SiC) film having high uniformity in film thickness and film properties and further having excellent film surface smoothness by a hot wall type, low pressure CVD method.

The present invention has been made to achieve the above object. The method for forming a silicon carbide film, provided by the present invention, uses a hot wall type CVD apparatus having a reaction tube, a heater surrounding the reaction tube and at least one gas-introducing tube to introduce gases to the reaction tube, and comprises placing substrates in the reaction tube and introducing a plurality of gases into the reaction tube through the gas-introducing tube with heating the reaction tube and under reduced pressure to form a silicon carbide film on each substrate, the silicon carbide film being formed on each substrate from at least an acetylene gas and a dichlorosilane gas as a plurality of the above gases by alternately repeating the following procedures (A) and (B), (A) introducing the acetylene gas for at least 2 seconds, and (B) introducing the dichlorosilane gas for 3 to 12 seconds.

DETAILED DESCRIPTION OF THE INVENTION

In the hot wall type, low pressure CVD method, the procedure of introducing an acetylene gas for at least 2 seconds and the procedure of introducing a dichlorosilane gas for 3 to 12 seconds are alternately repeated, whereby the reaction between the acetylene gas and the dichlorosilane gas in a gaseous phase in the reaction tube is inhibited, and a uniform concentration of each gas in the reaction tube is achieved. The number of repetitions of the above procedures is preferably 600 to 1,000.

The surface of each substrate is irradiated alternately with acetylene molecules and dichlorosilane molecules. Therefore, the molecules irradiated to the substrate surface are adsorbed on the substrate surface and react there to form silicon carbide (SiC).

Further, the formation of the silicon carbide film takes place through a reaction of the molecules adsorbed on each substrate surface. Therefore, when a crystalline substrate is used as substrate, there can be formed a silicon carbide film following the crystallinity of the substrate. That is, on a crystalline substrate, epitaxial growth of silicon carbide or growth of an oriented polycrystal can be achieved.

The reason for introducing an acetylene gas for at least 2 seconds is that acetylene cannot be sufficiently introduced into the reaction tube when introduced for less than 2 seconds. The time for introducing the acetylene gas is particularly preferably 5 to 60 seconds. The reason for introducing a dichlorosilane gas for 3 to 12 seconds is that almost no silicon carbide film is formed when it is introduced for less than 3 seconds, and that the growth of needle-like silicon carbide takes place to deteriorate the film surface smoothness when it is introduced for more than 12 seconds. The time for introducing the dichlorosilane gas is particularly preferably 5 to 7 seconds.

Further, as a carrier gas, there may be used a gas which does not contribute toward the formation of silicon carbide in the reaction tube, such as noble gases (helium, argon, neon, krypton and xenon) and hydrogen. In this case, the partial pressures of the source gases in a gaseous phase in the reaction tube can be decreased, and for example, the inclusion of a silicon (Si) cluster in the film caused by the thermal decomposition of dichlorosilane can be decreased. The source gases (acetylene and dichlorosilane)/carrier gas ratio is preferably 1/100 to 3/10 (v/v).

The present invention will be explained further in detail hereinafter by reference to Examples. However, the present invention shall not be limited to these Examples.

EXAMPLE 1

Silicon wafers [(111) face, resistivity 0.5 to 10 Ω·cm, n-type] having a diameter of 76±0.5 mm (3 inches) and a thickness of 380±10 μm were used as substrates.

An acetylene ($C_2H_2$) gas and a dichlorosilane ($SiH_2Cl_2$) gas were used as source gases, and a hydrogen ($H_2$) gas, as a carrier gas.

Figure 1:
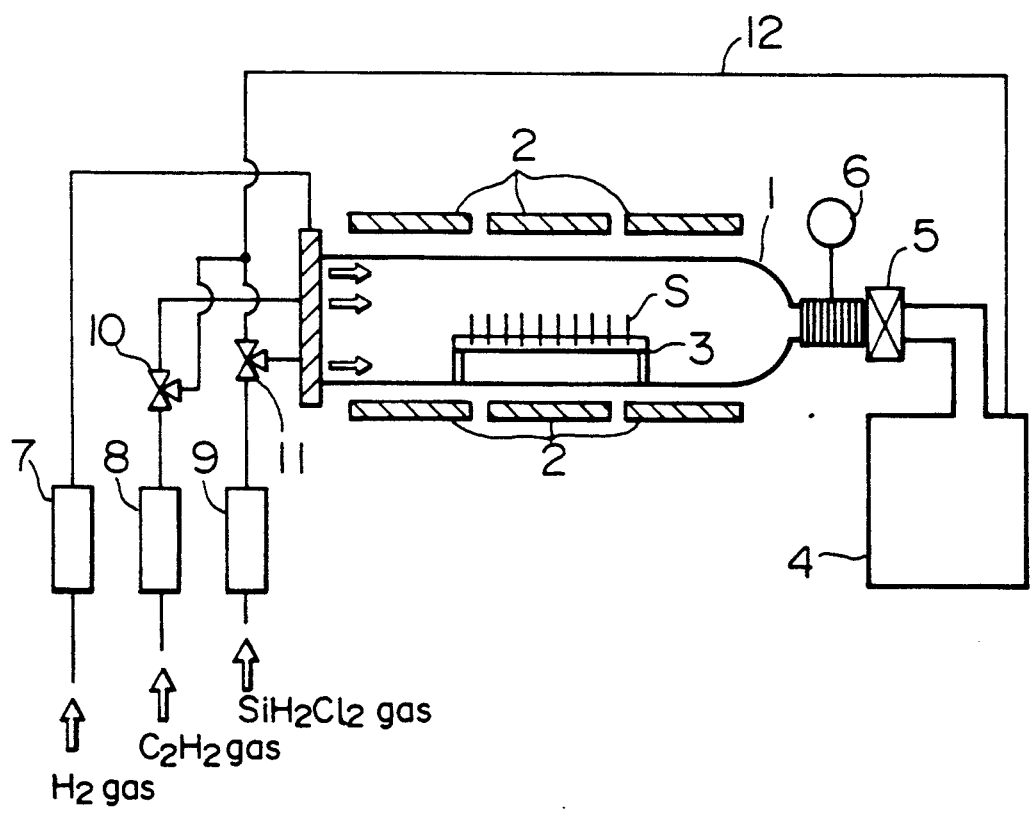
FIG. 1 schematically shows a hot wall type CVD apparatus.

In this Example, a silicon carbide film was formed by means of a resistance heating method-applied, hot wall type, low pressure CVD apparatus shown in FIG. 1.

As shown in FIG. 1, thirty-three substrates S were vertically placed, at intervals of 5 mm, on a substrate holder boat 3 in a reaction tube 1. And, the pressure in the reaction tube 1 was reduced to a vacuum of not more than $1.0 \times 10^{-3}$ Torr by actuating an exhaust pump 4, and the temperature inside the reaction tube 1 was elevated up to the range of 900° to 1,100° C. with a heater 2. The heater 2 was divided into three heater elements to facilitate the control of the temperature distribution in the reaction tube 1, and each heater element could be independently worked for temperature control.

Then, a hydrogen gas was introduced into the reaction tube 1. Further, (A) a three way valve 10 was operated to introduce an acetylene gas into the reaction tube for 2 to 60 seconds. Then the three way valve 10 was again operated to flow an acetylene gas into a bypass line 12, and the reaction tube 1 was evacuated with the exhaust pump 4. (B) Thereafter, a three way valve 11 was again operated to introduce a dichlorosilane gas into the reaction tube 1 to 3 to 12 seconds. Then, the three way valve 11 was operated to flow a dichlorosilane gas into the bypass line 12, and the reaction tube 1 was evacuated with the exhaust pump 4. These procedures (A) and (B) were alternately repeated at least 600 times.

In the above procedures, the gas in the reaction tube 1 was discharged with the exhaust pump 4, and the pressure in the reaction tube 1 was measured with a Pirani gauge 6 and controlled with a butterfly valve 5. Further, the flow rates of the hydrogen gas, the acetylene gas and the dichlorosilane gas were controlled with mass flow controllers 7, 8 and 9.

The above formation of silicon carbide films was carried out in two lots. The conditions for the silicon carbide film formation were as follows.

TABLE 1

| | | |
|---|---|---|
| Substrate | | Si (111) wafer |
| Growth temperature | | 900–1,100° C. |
| Partial pressures of source gases | $SiH_2Cl_2$ | 0.2–5.0 mTorr |
| | $C_2H_2$ | 0.2–5.0 mTorr |
| Time for source gas introduction per cycle | $SiH_2Cl_2$ | 3–12 seconds |
| | $C_2H_2$ | 2–60 seconds |
| Flow rates of source gases | $SiH_2Cl_2$ | 2 sccm |
| | $C_2H_2$ | 10 sccm |
| $H_2$ flow rate | | 300–1,000 sccm |
| Total pressure in reaction tube | | 0.035–0.17 Torr |

Figure 2:
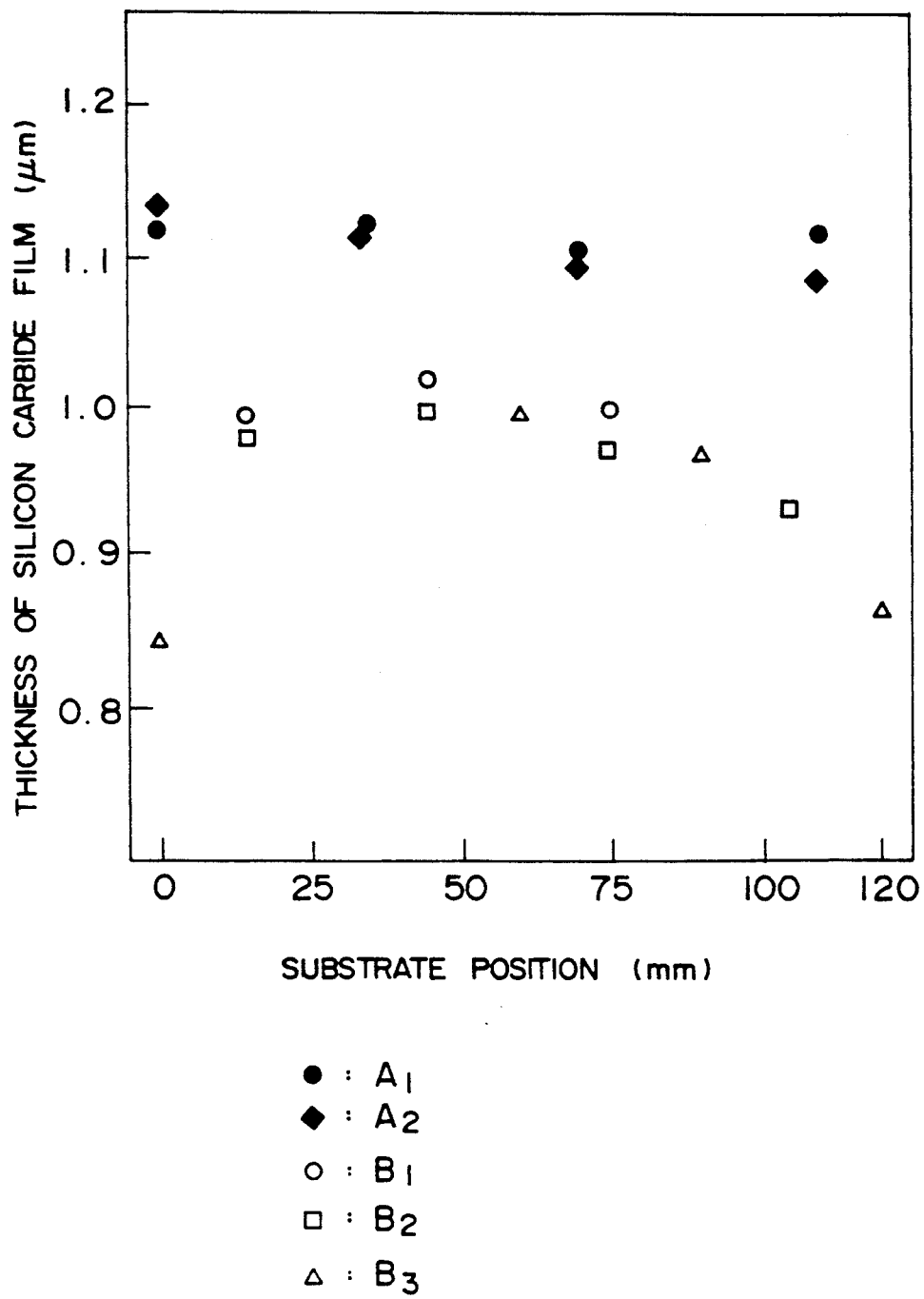
FIG. 2 shows the film thickness variability among substrates in each of Example and Comparative Example.

The silicon carbide films obtained in this Example were measured for a film thickness variability (maximum-minimum) among the substrates, and the results are shown as $A_1$ and $A_2$ in FIG. 2. $A_1$ indicates the measurement values obtained from the first lot, and $A_2$ indicates the measurement values obtained from the second lot. The position of each substrate is indicated as a distance from the substrate facing an opening for the gas introduction. These results show that the film thickness variability in each lot was within 3% of the average film thickness.

Figure 3:
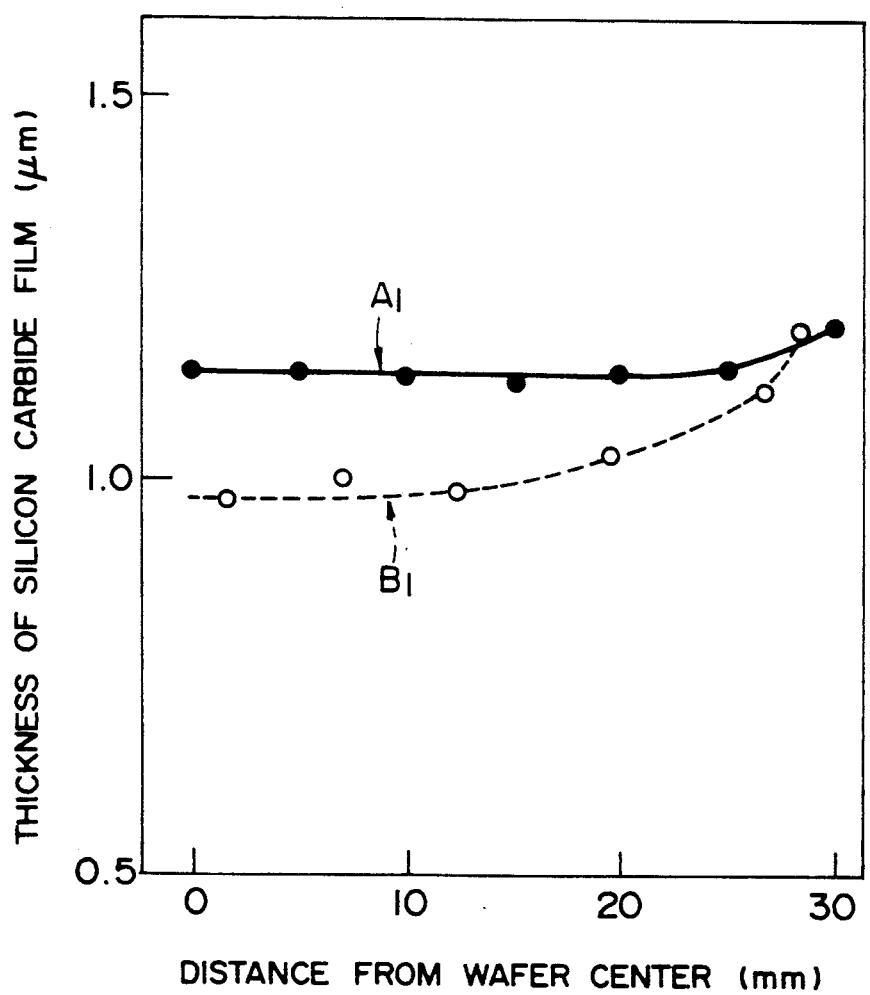
FIG. 3 shows the film thickness variability on one substrate surface in each of Example and Comparative Example.
Figure 4:
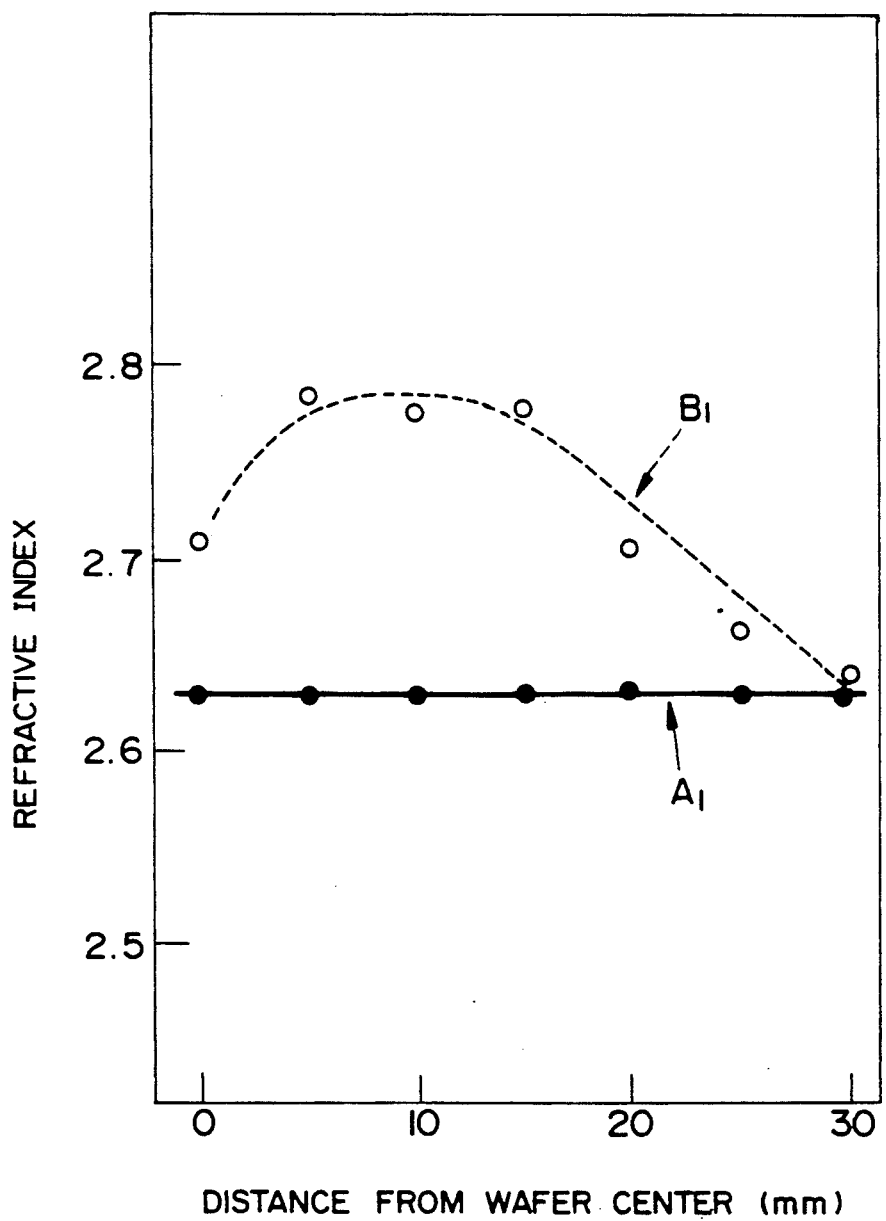
FIG. 4 shows the refractive index of one substrate surface in each of Example and Comparative Example.

Further, a silicon carbide film from the first lot was measured for a film thickness variability (maximum-minimum) within the substrate surface and a refractive index. The results are shown as $A_1$ in FIG. 3 and $A_1$ in FIG. 4. These results show that the film thickness variability was within 0.5% of the average film thickness and that the refractive index was 2.63 in the substrate surface or constant.

Further, the above-obtained films were measured for a surface roughness according to the center line average height Ra (JIS B0601) to show that Ra was 8 nm.

The silicon carbide films obtained in this Example were epitaxial layers following the crystallinity of the substrates. These silicon carbide films were observed by a reflective high-energy electron diffraction method (RHEED) to show that they were high-quality single crystals having neither a stacking fault nor a twin crystal. Further, these silicon carbide films were excellent in transmissivity to visible light.

Figure 5:
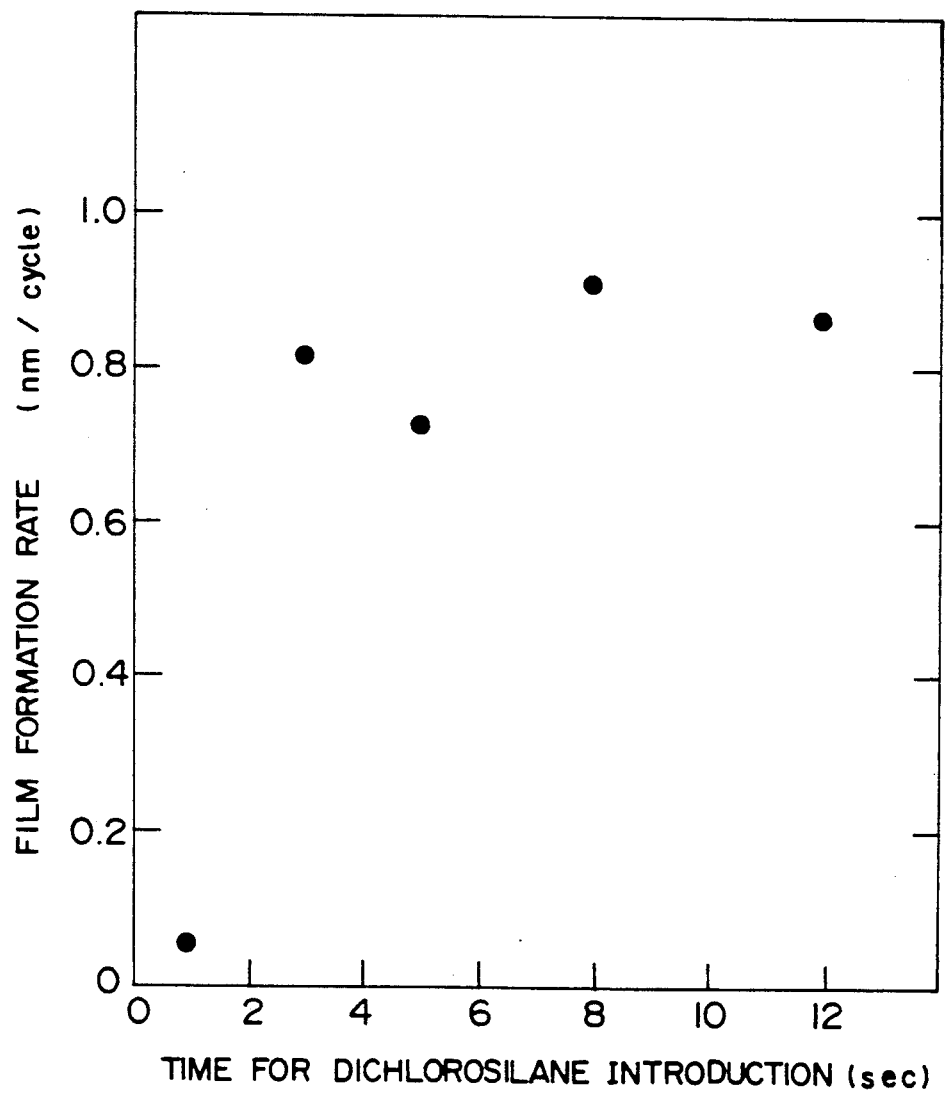
FIG. 5 shows the growth rate of a silicon carbide film.

FIG. 5 shows the growth rates of silicon carbide films per one operation (1 cycle) of the above procedures (A) and (B) relative to the time for dichlorosilane gas introduction when the time for acetylene gas introduction was set at a constant duration, 10 seconds. These results show that when the time for dichlorosilane gas introduction was set in the range of 3 to 12 seconds, the growth rate of silicon carbide was constant or 0.8 nm/cycle. Therefore, the thickness of the silicon carbide film can be accurately controlled on the basis of cycle numbers of repetition of alternate introduction of the gases.

EXAMPLE 2

Silicon carbide films were formed in the same manner as in Example 1 except that the silicon wafers as substrates were replaced with silicon wafers [(100) face, resistivity 0.5 to 10 Ω-cm, n-type] having a diameter of 76±0.5 mm (3 inches) and a thickness of 380±10 μm.

The so-obtained films showed similar values to those in Example 1 with regard to the film thickness variability, surface roughness and refractive index, and further, the films showed excellent controllability of the film growth rate and transmissivity to visible light.

The above-obtained silicon carbide films were also observed by an RHEED method to show that the RHEED pattern was ring-like and that the films were of a polycrystal. This is because face (100) silicon wafers were used as substrates. These polycrystals were oriented, and the films were silicon carbide films following the crystallinity of the substrates.

In Examples 1 and 2, a hydrogen gas was used as a carrier gas, while similar results can be obtained even when the hydrogen gas is replaced with a noble gas (helium, argon, neon, krypton or xenon).

COMPARATIVE EXAMPLE

An attempt was made to form silicon carbide films in the same manner as in Example 1 except that an acetylene gas and a dichlorosilane gas were introduced into the reaction tube at the same time. In this case, a reaction for forming silicon carbide occurred. However, no films were formed, and silicon carbide whiskers were obtained.

Therefore, silicon carbide films were formed by introducing a hydrogen gas, an acetylene gas and a dichlorosilane gas to the reaction tube at the same time under the conditions shown in Table 2. These films were formed in three lots.

TABLE 2

| Substrate | | Si (111) wafer |
|---|---|---|
| Growth temperature | | 900° C. |
| Flow rate | SiH$_2$Cl$_2$ | 200 sccm |
| of source | C$_2$H$_2$ | 30 sccm |
| gases | | |
| Flow rates | | 114 cm/second |
| of source | | |
| gases | | |
| Pressure | | 0.013 Torr |
| in reactor | | |

The film thickness variabilities (maximum-minimum) among substrates are shown as B$_1$, B$_2$ and B$_3$ in FIG. 2 as well as those in Example 1. B$_1$ indicates the measurement values obtained from the first lot, B$_2$ indicates the measurement values obtained from the second lot, and B$_3$ indicates the measurement values obtained from the third lot. These results show that the film thickness variabilities were 9% or more of the average film thickness.

Further, a silicon carbide film from the first lot was measured for a film thickness variability (maximum-minimum) within the substrate surface and a refractive index. The results are shown as B$_1$ in FIG. 3 and B$_1$ in FIG. 4. These results show that the film thickness variability amounted to no less than 15% of the average film thickness and that the refractive index also varied greatly.

Further, the above-obtained films showed a ring-like RHEED pattern, and it was found that these films were of a polycrystal. These polycrystals were not oriented.

As specified above, according to the method for forming a silicon carbide film, provided by the present invention, the silicon carbide film formed by alternately and repeatedly introducing an acetylene gas and a dichlorosilane gas into the reaction tube has high uniformity of the film thickness and film properties and shows excellence in the smoothness on the film surface, the crystallinity and the controllability.

Further, in the method for forming a silicon carbide, provided by the present invention, the silicon carbide film is formed by a reaction of molecules absorbed on a substrate surface. Therefore, when a crystalline substrate is used as a substrate, the epitaxial growth following the crystallinity of the substrate or the growth of an oriented crystal can be achieved.

Moreover, when there is used a noble gas or a hydrogen gas which does not contribute toward a reaction for forming silicon carbide in a reaction tube, the partial pressures of the source gases in a gaseous phase in the reaction tube are reduced. As a result, the inclusion of a silicon cluster in the film can be reduced, and there can be formed a silicon carbide (SiC) film having a stoichiometric composition.

Therefore, the silicon carbide film formed according to the present invention can be desirably used as an X-ray transmissive film for an X-ray mask or a substrate material for a semiconductor device.

What is claimed is:

1. A method for forming a silicon carbide film by means of a hot wall type CVD apparatus having a reaction tube, a heater surrounding the reaction tube and at least one gas-introducing tube to introduce gases to the reaction tube, which comprises placing a substrate in the reaction tube and introducing a plurality of gases into the reaction tube through the gas-introducing tube with heating the reaction tube and under reduced pressure to form a silicon carbide film on the substrate, the silicon carbide film being formed on the substrate from at least an acetylene gas and a dichlorosilane gas as a plurality of the above gases by alternately repeating the following procedures (A) and (B), (A) introducing the acetylene gas for at least 2 seconds, and (B) introducing the dichlorosilane gas for 3 to 12 seconds.

2. A method according to claim 1, wherein an acetylene gas, a dichlorosilane gas and at least one carrier gas selected from noble gases and a hydrogen gas are used as a plurality of the gases.

3. A method according to claim 2, wherein the (acetylene gas and dichlorosilane gas)/carrier gas ratio is 1/100 to 3/10 (v/v).

4. A method according to claim 2, wherein the carrier gas is helium, argon, neon, krypton or xenon.

5. A method according to claim 1, wherein the substrate is a crystalline substrate.

6. A method according to claim 1, wherein the substrate is a silicon wafer.

7. A method according to claim 1, wherein the procedures of (A) and (B) are repeated 600 to 1,000 times.

8. A method according to claim 1, wherein the time for introducing the acetylene gas in the procedure (A) is 5 to 60 seconds.

9. A method according to claim 1, wherein the time for introducing the dichlorosilane gas in the procedure (B) is 5 to 7 seconds.

10. A method for forming an X-ray transmissive silicon carbide film by means of a hot wall type CVD apparatus having a reaction tube, a heater surrounding the reaction tube and at least one gas-introducing tube to introduce gases to the reaction tube, which comprises placing a substrate in the reaction tube and introducing a plurality of gases into the reaction tube through the gas-introducing tube with heating the reaction tube and under reduced pressure to form a silicon carbide film on the substrate, the silicon carbide film being formed on the substrate from at least an acetylene gas and a dichlorosilane gas as a plurality of the above gases by alternately repeating the following procedures (A) and (B), (A) introducing the acetylene gas for at least 2 seconds, and (B) introducing the dichlorosilane gas for 3 to 12 seconds.

* * * * *